United States Patent
Dooms et al.

(10) Patent No.: US 7,777,494 B2
(45) Date of Patent: Aug. 17, 2010

(54) ARRANGEMENT FOR RECEIVING AND/OR TRANSMITTING RF SIGNALS ESPECIALLY IN A MRI SYSTEM

(75) Inventors: Patrick Dooms, Eindhoven (NL); Koos Mulder, Eindhoven (NL)

(73) Assignee: Koniklijke Philips Electronics N.V., Eindhoven (NL)

( * ) Notice: Subject to any disclaimer, the term of this patent is extended or adjusted under 35 U.S.C. 154(b) by 72 days.

(21) Appl. No.: 12/096,187

(22) PCT Filed: Nov. 15, 2006

(86) PCT No.: PCT/IB2006/054284
§ 371 (c)(1),
(2), (4) Date: Jun. 5, 2008

(87) PCT Pub. No.: WO2007/066250
PCT Pub. Date: Jun. 14, 2007

(65) Prior Publication Data
US 2008/0309341 A1 Dec. 18, 2008

Related U.S. Application Data

(60) Provisional application No. 60/748,402, filed on Dec. 8, 2005.

(51) Int. Cl.
*G01V 3/00* (2006.01)
(52) U.S. Cl. .................................... 324/322; 324/318
(58) Field of Classification Search .............. 324/322, 324/318
See application file for complete search history.

(56) References Cited

U.S. PATENT DOCUMENTS

| 5,059,906 A | 10/1991 | Yamanaka |
| 5,296,813 A | 3/1994 | Holmes et al. |
| 5,384,536 A * | 1/1995 | Murakami et al. .......... 324/309 |
| 5,491,415 A | 2/1996 | Holmes et al. |
| 5,543,711 A | 8/1996 | Srinivasan et al. |
| 5,550,471 A | 8/1996 | Feld |
| 6,339,717 B1 | 1/2002 | Baumgartl et al. |

(Continued)

FOREIGN PATENT DOCUMENTS

JP 01223943 A 9/1989

(Continued)

*Primary Examiner*—Louis M Arana

(57) ABSTRACT

An arrangement for receiving and/or transmitting RF signals and for feeding the same in a digital format between at least one RF antenna, coil and/or sensor unit (A, B) and a signal processing unit (8), by means of at least one digital cable (121, . . . 12*n*), especially for use in a magnetic resonance (MR) imaging system is disclosed, wherein at least one of the RF antenna, coil and/or sensor units (A, B) and at least one side of the digital cables (121, . . . 12*n*) is provided with a digital signal connector (10*c*, 11*a*; 121*a*, 121*b*, . . . 12*na*, 12*nb*) for separably connecting both by plugging the connectors together. By transmitting the RF signals in a digital format, especially in a digital optical format, a plurality of digital cables (121, . . . 12*n*) with different lengths and digital connectors (121*a*, 121*b*, . . . 12*na*, 12*nb*) can be used which need not to be an inseparable part of the related RF antenna, coil or sensor, so that a great flexibility is achieved with respect to positioning of the RF antennas, coils and/or sensors for an examination, and a disturbance-free transmission of the RF signals can be ensured as well.

15 Claims, 1 Drawing Sheet

U.S. PATENT DOCUMENTS

Figure 1:
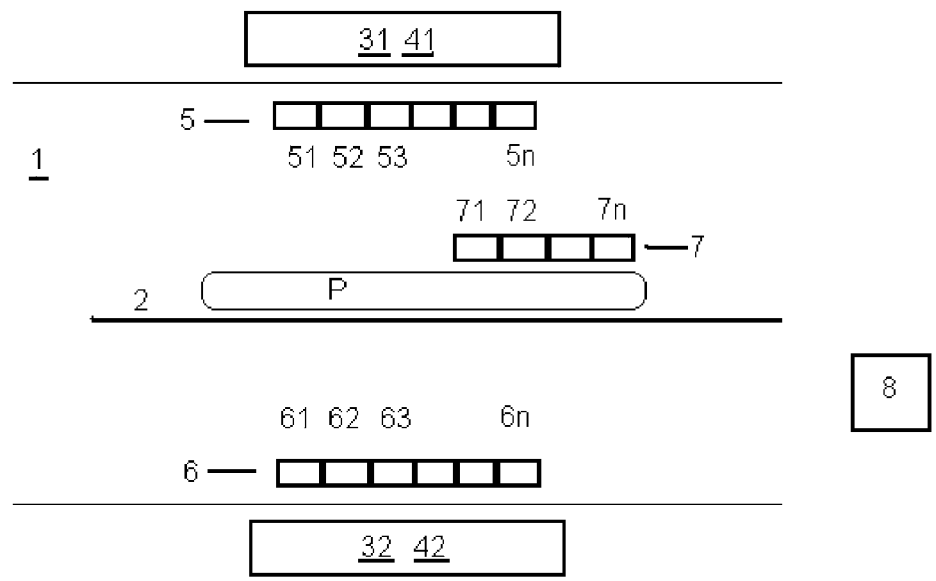

| | | |
|---|---|---|
| 6,362,622 B1 | 3/2002 | Stauber et al. |
| 6,498,489 B1 | 12/2002 | Vij |
| 6,653,833 B2 | 11/2003 | Baumgartl et al. |
| 7,173,426 B1 * | 2/2007 | Bulumulla et al. .......... 324/318 |
| 7,443,165 B2 * | 10/2008 | Varjo ........................ 324/322 |
| 2005/0107681 A1 | 5/2005 | Griffiths |

FOREIGN PATENT DOCUMENTS

| | | |
|---|---|---|
| JP | 03045246 | 2/1991 |
| JP | 05293093 A | 11/1993 |
| WO | 2004099211 A2 | 10/2004 |

* cited by examiner

ARRANGEMENT FOR RECEIVING AND/OR TRANSMITTING RF SIGNALS ESPECIALLY IN A MRI SYSTEM

CROSS REFERENCE TO RELATED APPLICATIONS

This application claims the benefit of U.S. provisional application Ser. No. 60/748,402 filed Dec. 8, 2005, which is incorporated herein by reference.

The invention relates to an arrangement for receiving and/or transmitting RF signals and for feeding the same in a digital format between at least one RF antenna, coil and/or sensor unit and a signal processing unit, especially in a magnetic resonance imaging (MRI) system. The invention further relates to accordingly adapted RF antennas, coils and sensors for use in such an arrangement, and to a magnetic resonance imaging system comprising such an arrangement.

Magnetic resonance imaging is a well-known noninvasive medical diagnostic method for examining a body tissue. The spins of the nuclei of the tissue are aligned in a strong magnetic field and then excited by transmitting RF pulses by means of one or more RF transmitter antennas with the Larmor frequency. The magnetic resonance or relaxation of the spins of the nuclei is detected by the same or by one or a plurality of RF receiver antennas, coils or sensors, like for example in the form of relatively large body coils, and/or by one or more surface coils for certain parts of a body, like a head coil, and/or a small detector coil at the tip of a catheter. On the basis of these resonance signals, images of the body tissue with high quality and a high resolution can be generated by means of a signal processing or image reconstruction unit.

All these RF transmitter and receiver antennas, coils and sensors have to be connected to a signal processing unit (like especially an image reconstruction unit), for controlling and power-supplying the antennas, for feeding the RF pulses to be transmitted and for feeding the received resonance signals in order to generate images.

WO 2004/089211 discloses a magnetic resonance examination apparatus including a receiving assembly located in the vicinity of an examination zone for producing a signal in response to spin resonance signals for transmission to a signal processing unit. To overcome problems associated with metallic cable connections between the receiving assembly and the signal processing unit, the receiving assembly comprises a digitizer for generating a digital signal in response to the spin resonance signal. Furthermore, an optical transducer is proposed for converting the digital signal to an optical signal for transmitting the same via optical couplers and an optical fiber link or as an infrared signal through free space to an optical receiver of the signal processing unit.

Alternatively, according to the WO 2004/089211, a transducer and a transmitter can be provided for converting the spin resonance signal to a digital modulated radio frequency signal for transmitting the same via a radio communication link through free space to a receiver of the signal processing unit.

A disadvantage of a transmission of an optical signal through an optical fiber or through free space as well as of a radio frequency transmission through free space is that nevertheless a galvanic cable connection is usually needed for supplying power to the receiving assembly and/or for controlling the same especially in case that the receiving assembly is provided in the form of an RF antenna, coil and/or sensor unit having no own power supply and/or is to be used for transmitting RF excitation signals as well. Consequently, the freedom of positioning the receiving assembly and especially the receiver coil(s) is restricted due to a certain length of such a galvanic cable connection.

Furthermore, in case of a transmission through free space, usually the transmitter and the receiver have to be aligned to each other, and if there is no direct line of sight between both, the transmission may be disturbed or interrupted.

An object underlying the invention is to overcome these disadvantages and to provide an arrangement for receiving and/or transmitting RF signals and for feeding the same in a digital format between at least one RF antenna, coil and/or sensor unit and a signal processing unit, which is reliable and flexible in use especially in case of mobile RF antennas like surface coils for certain parts of a body (e.g. a head coil) and/or a small detector coil at the tip of a catheter.

The object is solved by such by an arrangement which comprises at least one digital cable, wherein at least one of the RF antenna, coil and/or sensor units and at least one side of the digital cable is provided with a digital signal connector for separably connecting both by plugging the connectors together.

By providing digital cables in combination with digital and separable connectors, a great flexibility is achieved during positioning and with respect to the selection of the position of the RF antenna, coil and/or sensor unit for a certain examination. Especially in case of providing a plurality of digital cables with different lengths, an appropriate cable can be selected and connected with the RF antenna, coil and/or sensor unit after having positioned the same, without having to fear RF interactions between the RF antenna and the cable, as in case of using analog cables with different lengths.

An RF antenna, coil and/or sensor unit and a related cable need not to be an inseparable part any more because by using digital cables and a digital format, a disturbance-free and interaction-free transmission of the RF signals can be ensured for digital cables with different lengths as well.

Embodiments are provided for digital and analog RF antennas, coils and/or sensors, respectively, so that an arrangement with both kinds of antennas can be provided and especially those conventional RF antennas, coils and sensors can be used which have an analog signal output only.

A disturbance-free and interaction-free transmission of the RF signals in the arrangement is further improved.

Even in case of using an optical digital format, the related RF antenna, coil and/or sensor unit can be supplied with e.g. a DC power as well.

Further details, features and advantages of the invention are disclosed in the following description of exemplary preferred embodiments of the invention with reference to the drawings in which shows:

FIG. 1 a schematic block diagram of substantial parts of a MR system; and

Figure 2:
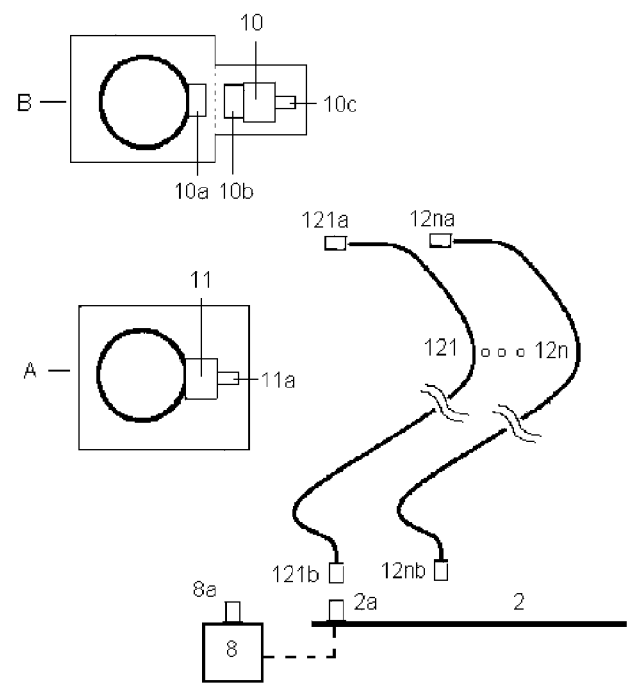

FIG. 2 a schematic view of a first and a second embodiment of an arrangement according to the invention.

FIG. 1 schematically shows a longitudinal section through a cylindrical or tubular examination space (or scanner room) 1 of a MR system. A patient table 2 for carrying a patient or another examination object P is guided in an axial direction through the cylindrical space 1.

The system comprises main magnets 31, 32 for generating a static magnetic field ($B_0$ field) for aligning the spins of the nuclei in the tissue to be examined.

The system furthermore comprises gradient magnets (coils) 41, 42 for generating magnetic fields having a gradient in the three orthogonal directions (x-, y- and z-direction) in order to enable a spatial or slice selection and spatial encoding of the received RF signals in a known manner.

Generally, a plurality of RF excitation coils or antennas is provided for transmitting RF pulses ($B_1$ field) to excite the nuclei, and a plurality of RF detection coils or antennas or sensors is provided for receiving and detecting the RF relaxation or resonance signals emitted from the nuclei.

According to FIG. 1, a stationary first and second body coil 5, 6 for imaging the whole body of a patient is provided, for example in the form of a conductor structure on a plane carrier like a circuit board. Such a conductor structure can be divided into a plurality of coil elements 51, 52, . . . 5n; 61, 62, . . . 6n, which can be controlled independently from each other for transmitting RF pulses and/or receiving RF relaxation signals, respectively.

Finally, one or a plurality of mobile surface coils 71, 72, . . . 7n for certain parts of a body like a head coil and/or a detector coil at the tip of a catheter for receiving RF signals from definite areas of a patient P are provided which are designated commonly with the reference number 7.

The units for controlling and power-supplying these RF transmit and receive antennas, coils or sensors, and for processing and evaluating the received signals and for generating images or other analysis are indicated commonly by reference number 8. A more detailed explanation of these units is for example disclosed in the prior art document US 2005/0107681 A1.

For feeding the received magnetic resonance signals from the RF antennas, coils or sensors 5, 6, 7 to the related signal processing, evaluating and/or image reconstruction unit or other analysis equipment 8, as well as for power-supplying and controlling the coil segments 51, 52, . . . ; 61, 62, . . . , 71, 72, . . . of the antennas, coils or sensors 5, 6, 7 for transmitting and receiving RF signals, an arrangement according to the invention is provided.

The arrangement can be provided in at least two embodiments which are selected in dependence on the kind of the RF antenna, coil or sensor 5, 6, 7 which is to be connected with the signal processing or image reconstruction unit 8, especially with respect to the kind of output signals generated by the RF antenna, coil or sensor 5, 6, 7 and whether these signals are available in an analog or digital format.

A first embodiment of the arrangement is provided for connecting at least one digital RF antenna, coil or sensor unit A which comprises an RF antenna, coil or sensor 5, 6, 7 and an analog-to-digital converter circuit board 11 for converting the received magnetic resonance signals into a digital format and preferably for generating digital optical signals in the form of digital fiber optical output signals by means of an appropriate light source.

The first embodiment of the arrangement comprises a plurality of digital cables 121, . . . 12n, with a digital connector 121a, 121b; . . . 12na, 12nb at each side. The digital RF antenna unit A, especially the related A/D converter circuit board 11, comprises a digital connector 11a for separably connecting the same with a first connector 121a, . . . 12na at one end of such a cable 121, . . . 12n by plugging both together. Such connectors are generally known in the prior art.

The other end of the cable 121, . . . 12n, is connected by means of the second digital connector 121b, . . . 12nb with a reconstruction unit 8 which comprises a corresponding digital connector 8a. Alternatively, the cable 121, . . . 12n can be connected e.g. with a related digital connector 2a at the patient table 2 which itself is connected with the signal processing or image reconstruction unit 8.

The digital cables 121, . . . 12n are preferably provided in the form of a set of digital cables with different lengths which can be kept e.g. in a special rack near, in or on the coil cabinet.

Furthermore, the digital cables 121, . . . 12n are preferably provided in the form of optical digital cables. In this case, in order to enable a power supply of the RF antennas, coils or sensors, the digital cable is preferably provided as a segmented digital cable comprising at least one optical fiber for transmitting the RF signals, and at least one galvanic cable for feeding the supply (DC) power. The galvanic cable/cables is/are preferably twisted around the optical fiber(s).

Correspondingly, the digital connectors 121a, 121b; . . . 12na, 12nb at each side of the cables 121 . . . 12n and the digital connector 11a at the circuit board 11, as well as the connector 8a at the reconstruction unit 8 (or the connector 2a at the patient table 2) preferably comprise a fiber-optic interface for optically contacting the at least one optical fiber and a galvanic interface for electrically contacting the at least one galvanic cable.

Due to the fact that there is no RF signal transport over galvanic cables (and consequently no interactions or disturbances between the RF antennas, coils and sensors on the one hand and the related cable on the other hand), there is no need anymore to inseparably fix the cable at the related RF antenna, coil or sensor. By this, a high flexibility is achieved for a user. If e.g. in case of an examination, the RF antennas, coils and sensors have been positioned in the desired place around a patient or an examination object, a cable 121, . . . 12n with a proper length is selected and used to connect the same with the signal processing or image reconstruction unit 8, directly or via the connector 2a at the patient table 2.

Furthermore, it is also possible to leave the cables connected at the signal processing or image reconstruction unit 8 and make "connect system to the coil" possible. In this case, the cables 121, . . . 12n are provided only at one end with a connector 121a, . . . 12na.

A second embodiment of the arrangement is provided for connecting at least one analog RF antenna, coil or sensor 5, 6, 7 which does not comprise any analog-to-digital converter circuit board 11, but which outputs the received magnetic resonance signals in an analog format.

The second embodiment of the arrangement comprises at least one separate analog-to-digital converter 10 for converting the analog output signals into a digital format and preferably for generating digital optical signals in the form of digital fiber optical output signals as explained above with respect to the circuit board 11.

Such a separate A/D-converter 10, preferably in the form of a small box, comprises a first analog connector or interface 10b for connecting the converter 10 with a corresponding analog connector or interface 10a at the analog RF antenna, so that both together form a digital RF antenna unit B. Furthermore, the A/D-converter 10 comprises a second digital connector 10c for connecting the same with a digital connector 121a, . . . 12na at one end of a digital cable 121 . . . 12n as explained above with respect to the digital RF antenna unit A.

Again, the digital cables 121, . . . 12n are preferably provided in the form of a set of digital cables with different lengths.

Furthermore, the digital cables 121, . . . 12n are preferably provided in the form of digital optical cables, and correspondingly comprise at least one optical fiber and at least one galvanic cable as explained above.

In this case, additionally to the digital connectors 121a, 121b; . . . 12na, 12nb at each side of the digital cables 121, . . . 12n, the connector 10c at the converter 10 preferably comprises as well a fiber-optic interface for optically contacting the at least one optical fiber and a galvanic interface for electrically contacting the at least one galvanic cable.

Finally, the arrangement according to the invention can comprise RF antenna, coil and/or sensor units for transmitting RF signals or pulses as mentioned above as well.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. An arrangement for receiving and/or transmitting RF signals in a digital format comprising:
    a digital MR unit;
    a signal processing unit;
    at least one digital cable;
    a first digital signal connector including a first digital connector component connected with the MR unit and a digital cable connector component connected with one end of one of the at least one digital cable, the first digital connector component and the digital cable connector component plugging together to connect the MR unit and the ditigal cable to convey digital signals therebetween.

2. The arrangement according to claim 1, wherein the MR unit includes:
    at least one of an RF antenna, an RF coil, and a sensor which receives RF signals; and
    an analog-to-digital converter which converts the received RF signals into digital format, and communicates the digital RF signal through the first digital signal connector to the digital cable.

3. The arrangement according to claim 1, wherein the MR unit includes:
    at least one of an analog RF antenna, an RF coil and an RF sensor which receives RF signals; and
    a first analog signal connector component; and, the arrangement further includes:
        a separate analog-to-digital converter for converting a which converts received RF signals into a digital format, the analog to digital converter being connected with an analog galvanic connector component that plugs into the first analog RF connector component and being connected with the first digital connector component.

4. The arrangement according to claim 1, wherein the digital signal is an optical digital signal, and the digital cables comprise includes at least one optical fiber, and the first digital connector component and the digital cable connector component including at least one fiber-optic interface.

5. The arrangement according to claim 1, wherein the at least one digital cable includes at least one optical fiber and at least one galvanic cable, the first digital connector component and the digital cable connector component including both a galvanic interface and a fiber optic interface.

6. The arrangement according to claim 5, wherein the at least one galvanic cable is twisted around the at least one optical fiber.

7. An RF antenna or coil for use in the arrangement of claim 1, including an analog to digital converter which converts a received RF signal into a digital format, the first digital connector component being connected to the analog to digital converter to output the received RF signal in the digital format to the digital cable.

8. The RF antenna or coil sensor unit according to claim 7, wherein the digital format is a digital optical format and the first digital signal connector includes at least one galvanic interface and at least one fiber-optic interface.

9. Magnetic resonance imaging system for transmitting RF pulses and/or for receiving magnetic resonance signals, comprising at least one arrangement according to claim 1.

10. An arrangement for receiving and/or transmitting RF signals and for feeding the same in a digital format between at least one RF antenna, coil and/or sensor unit and a signal processing unit, by means of at least one digital cable, wherein at least one of the RF antenna, coil and/or sensor units and at least one side of the digital cables is provided with a digital signal connector for separably connecting both by plugging the connectors together, wherein the digital format is a digital optical format, and the digital cables comprise at least one optical fiber, and the digital signal connectors comprise at least one fiber-optic interface, wherein the digital cables comprise at least one galvanic cable, wherein the at least one galvanic cable is twisted around the at least one optical fiber.

11. In an MR system in which magnets generate magnetic fields in an examination region, RF coils excite resonance in an object supported on a table in the examination region, and a signal processor processes received resonance signals:
    a plurality of portable RF antenna or coil units which are removably disposed in the examination, each portable unit including:
        an RF antenna or coil to receive the resonance signals,
        an analog-to-digital converter connected to the RF coil or antenna to convert the received resonance signals into digital signals, and
        a portable unit digital connector component connected with the analog to digital converter to output the digital signals;
    a plurality of digital cables of a plurality of different lengths, each cable including:
        a first digital cable digital connector component at a first end of the cable, the first cable digital connector component releasably connecting to the portable unit digital connector component; and
        a second cable digital connector component at a second end of the cable, the second cable digital connector component releasably connecting to a signal processor digital connector component connected with the signal processor;
    such that a selected one of the portable units is connectable with the signal processor using a selected one of the plurality of digital cables within a selected one of the plurality of lengths.

12. In the MR system according to claim 11, wherein the signal processor digital cable connector component is mounted to the table.

13. In the MR system according to claim 11, wherein the analog-to-digital converter is a separate unit and the portable unit further includes:
    a first analog connector component connected with the RF antenna or coil and a second analog connected component connected with an input of the analog-to-digital converter, the first and second analog connector components releasably plugging into each other.

14. In the MR system according to claim 11, wherein the digital cables each further include at least one galvanic cable and wherein the first cable digital connector component and the portable unit digital connector component each include both a digital interface and a galvanic interface, and the second cable digital connector component and the signal processor digital connector component both include a galvanic interface and a digital interface.

15. In the MR system according to claim 14, wherein the digital cables include optical fibers and the digital interfaces includes fiber-optic interfaces.

* * * * *